(12) United States Patent
Hsu

(10) Patent No.: US 6,986,383 B2
(45) Date of Patent: Jan. 17, 2006

(54) END SURFACE STRUCTURE OF A HEAT PIPE FOR CONTACT WITH A HEAT SOURCE

(76) Inventor: Hul-Chun Hsu, 6F-3, No. 422, Sec. 2, Li-Ming Rd., Taichung (TW)

( * ) Notice: Subject to any disclaimer, the term of this patent is extended or adjusted under 35 U.S.C. 154(b) by 0 days.

(21) Appl. No.: 10/811,888

(22) Filed: Mar. 30, 2004

(65) Prior Publication Data
US 2005/0224215 A1 Oct. 13, 2005

(51) Int. Cl.
*F28D 15/00* (2006.01)
(52) U.S. Cl. ............... 165/104.26; 165/104.33; 361/697; 361/700; 257/715
(58) Field of Classification Search ........... 165/104.26, 165/104.21, 104.33, 185, 80.4; 361/697, 361/699, 700; 257/714–716; 174/15.2
See application file for complete search history.

(56) References Cited
U.S. PATENT DOCUMENTS

| | | | | |
|---|---|---|---|---|
| 2,883,591 A | * | 4/1959 | Camp ....................... 257/715 |
| 2,958,021 A | * | 10/1960 | Boyd et al. ................ 257/715 |
| 4,929,414 A | * | 5/1990 | Leonard et al. ................ 419/2 |
| 5,412,535 A | * | 5/1995 | Chao et al. .................. 361/700 |
| 5,582,242 A | * | 12/1996 | Hamburgen et al. ... 165/104.21 |
| 5,632,158 A | * | 5/1997 | Tajima ....................... 62/259.2 |
| 6,793,009 B1 | * | 9/2004 | Sarraf ..................... 165/104.33 |
| 6,827,133 B1 | * | 12/2004 | Luo ....................... 165/104.21 |
| 2003/0066628 A1 | * | 4/2003 | Mochizuki et al. ..... 165/104.26 |

\* cited by examiner

*Primary Examiner*—Terrell McKinnon

(57) ABSTRACT

An end surface structure of a heat pipe having a large gauge used to be contacted with a heat source for dissipation is provided. The heat pipe includes a pipe member, a lid, a base and a wick structure. The hollow tubular pipe member includes two opposing open ends. The lid is closely covered on one open end. The base includes an interlocking member fitly engaged to the other open end of the pipe member and a flange extending radially and outwardly from the interlocking member. Moreover, the thickness of the flange is not larger than the thickness of pipe member at the open end receiving the interlocking member. When the base is fitted with the pipe member at the open end, a welding process is performed to permanently connect them together. In the welding process, the flange is enforced to be liquefied first and is liquefied more than the pipe member at the open end. As such, it can ensure that the pipe member is prevented from being damaged during the welding process.

9 Claims, 5 Drawing Sheets

END SURFACE STRUCTURE OF A HEAT PIPE FOR CONTACT WITH A HEAT SOURCE

BACKGROUND OF THE INVENTION

The present invention relates in general to an end surface structure of a heat pipe, and more particularly, to an end surface structure of a heat pipe having a large gauge, which is used to be contacted with a heat source for dissipation.

Having the characteristics of high thermal conductivity, fast thermal conduction, light weight, non-movable components and simple structure, the heat pipes are able to deliver large amount of heat without consuming electricity, and are therefore commonly used in the market.

FIG. 1 illustrates a heat pipe 1a having one end capably to be contacted with a heat source for dissipation. The heat pipe 1a includes a lid 12a, and a pipe member 10a with a close end and an open end. A wick structure 11a is attached to the inner wall of the pipe member 10a and the working fluid will be filled in the pipe member 10a thereafter. The wick structure 11a provides capillary force to transport the working fluid filled in the pipe member 1a. The lid 12a is provided to cover on the open end of the pipe member 1a. The lid 12a has a filling tube 120a for the working fluid to be filled into the pipe member 1a thereby. Moreover, after some further process such as vacuuming, the pipe member 10a is sealed with a sealing structure 121a on the filling tube 120a by the application of tin or soldering.

The above heat pipe 1a has a large gauge and provides a flat surface 100a to be contacted with the heat source. Therefore, in application, the heat pipe 1a can stand on the heat source.

However, normally this kind of heat pipe 1a is fabricated by forging process. Therefore, the fabrication is more difficult with higher cost and is impossible for mass production. Furthermore, the heat pipe 1a with longer pipe member 10a may not be fabricated by forging. Such that, the large gauge heat pipe is still highly demanded in market.

Therefore, there exist inconvenience and drawbacks for practically application of the above-mentioned heat pipe. There is thus a substantial need to provide an improved end surface structure of heat pipe that resolves the above drawbacks and can be used more conveniently and practically.

SUMMARY OF THE INVENTION

The present invention provides an end surface structure of a heat pipe that can be easily fabricated and suitable for mass production.

The end surface structure provided by the present invention includes a pipe member, a lid and a base. The pipe member is a hollow tube with a wick structure attached to an inner wall thereof. The pipe member includes two opposing open ends. The lid is closely covered on one open end. The base includes an interlocking member fitly engaged to the other open end of the pipe member and a flange extending radially and outwardly from the interlocking member. Moreover, the thickness of the flange is not larger than the thickness of pipe member at the open end receiving the interlocking member. When the base is fitted with the pipe member at the open end, a welding process is performed to permanently connect them together. In the welding process, the flange is enforced to be liquefied first and is liquefied more than the pipe member at the open end. As such, it can ensure that the pipe member is prevented from being damaged during the welding process, and an effective production can be obtained.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF ACCOMPANIED DRAWINGS

The above objects and advantages of the present invention will be become more apparent by describing in detail exemplary embodiments thereof with reference to the attached drawings in which.

DETAILED DESCRIPTION OF EMBODIMENT

Figure 1:
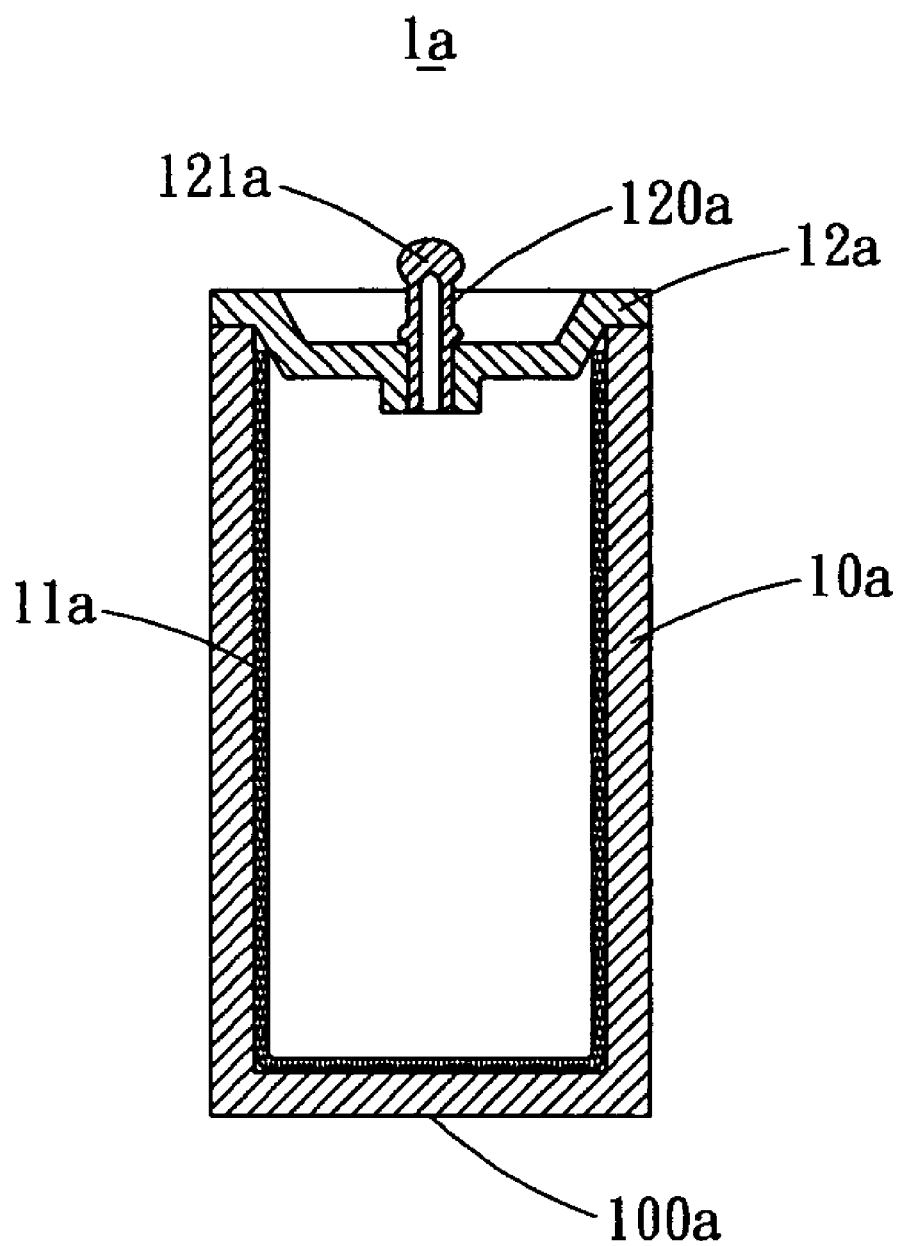
FIG. 1 illustrates a cross sectional view of a conventional heat pipe.

Reference will now be made in detail to the preferred embodiments of the present invention, examples of which are illustrated in the accompanying drawings. Wherever possible, the same reference numbers are used in the drawings and the description to refer to the same or like parts.

Figure 2:
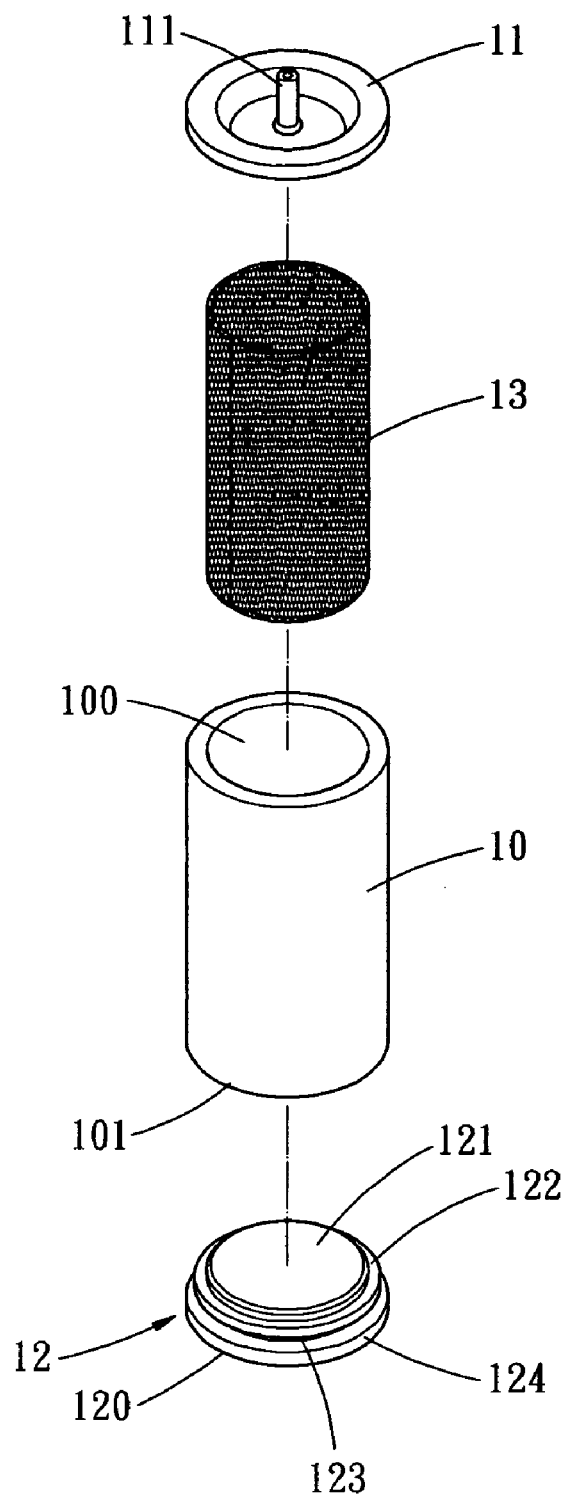
FIG. 2 shows an exploded view of a heat pipe provided by the present invention.
Figure 3:
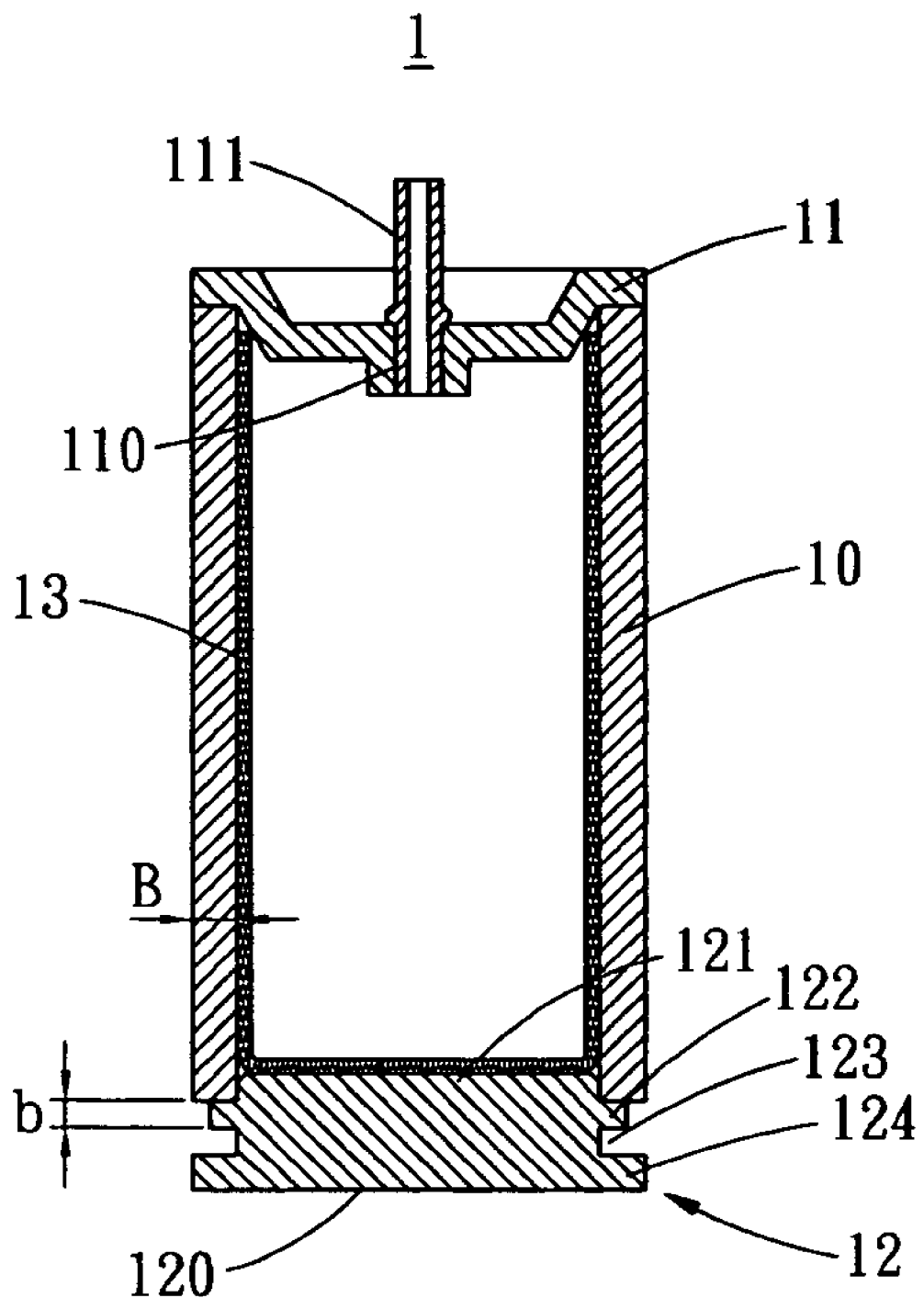
FIG. 3 is a cross sectional view of the assembled heat pipe.

As shown in FIGS. 2 and 3, the exploded view and cross sectional view of a heat pipe provided by the present invention are illustrated. As shown, the heat pipe 1 includes a pipe member 10, a lid 11 and a base 12.

Figure 4:
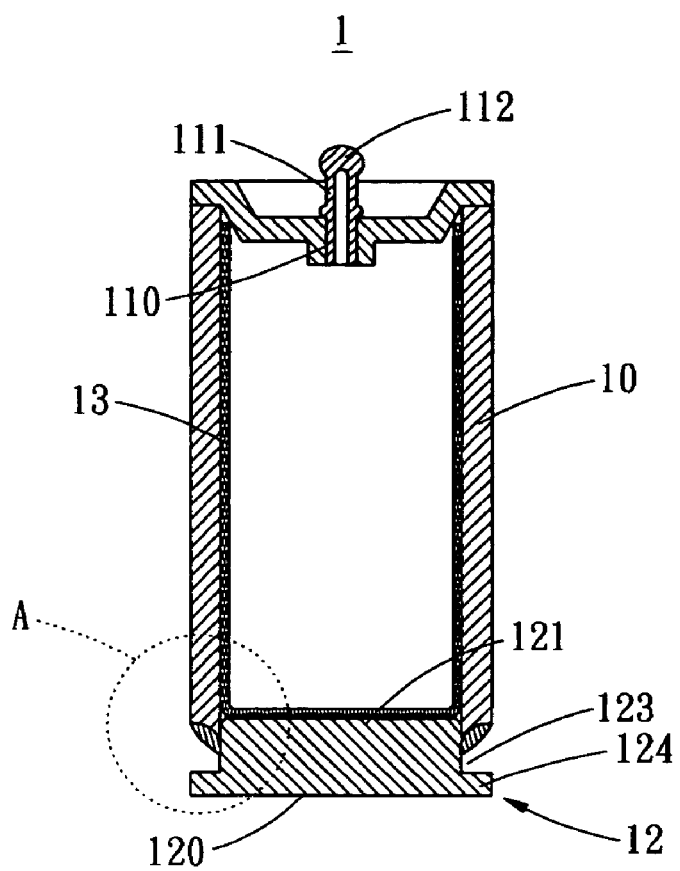
FIG. 4 is a cross sectional view of the heat pipe after a welding process.

The pipe member 10 is preferably a cylindrical hollow tube with two open ends 100 and 101. A wick structure 13 is attached to an inner wall of the pipe member 10. The lid 11 includes a thin plate fabricated by press, for example, and is applied to seal the pipe member 10 at one open end 100 by closely covering thereon. The other open end 101 is then sealed by the base 12, and the wick structure 13 is further attached on the inside surface (opposite to the outside surface 120) of the base 12. In addition, the lid 11 has a through hole 110 for a filling tube 111 being mounted therein, such that the working fluid can be filled inside the pipe member 10 thereby. After some further process such as vacuuming, the heat pipe 1 is sealed with a sealing structure 112 (as shown in FIG. 4) on the filling tube 113 by the application of tin or soldering. Furthermore, the base 12 provides the outside surface 120 which is a flat surface for contact with a heat source. Therefore, the heat pipe 1 with an end surface to be contacted with the heat source for dissipation is obtained.

In the present invention, the pipe member 10 is permanently connected with the base 12 by a welding process after interlocking them together. The base 12 includes an interlocking member 121 to fit the base 12 engaged with the pipe member 10 at the open end 101. Extending from the interlocking member 121 is a flange 122 of which the peripheral diameter is larger than the interior diameter and preferably smaller than the exterior diameter of the pipe member 10 at the open end 101. The flange 122 is made by forming an annular recess 123 along the periphery of the base 12. Therefore, the flange 122 is formed at an upper side of the annular recess 123 and a heat conducting portion 124 is formed under the annular recess 123. As the shape and the size of the interlocking member 121 is embedded in the open end 101 of the pipe member 10. Therefore, the interlocking member 112 positions the base 12 along the radial direction of the pipe member 10, while the flange 122 positions the base 12 along the axial direction of the pipe member 10. Moreover, the thickness b of the flange 122 is not larger than the thickness B of the wall (side surface) of the pipe member 10 at the open end 101.

Figure 5:
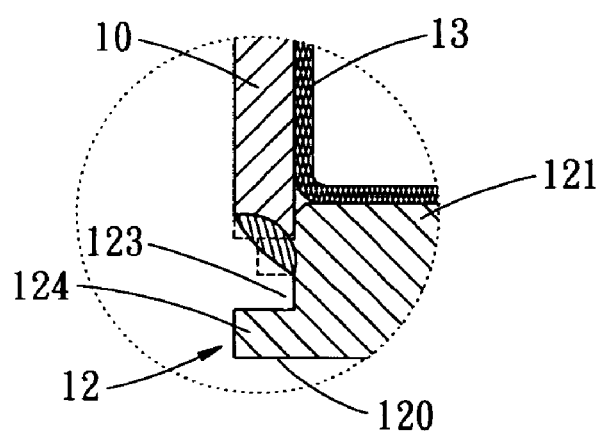
FIG. 5 shows a local enlarged view of the portion A as shown in FIG. 4.

As shown in FIGS. 4 and 5, while the base 12 is interlocked with the pipe member 10 at the open end 101, a welding process is applied. As the thickness b of the flange 122 is not larger than the thickness B of the wall of the pipe member 10 at the open end 101, the flange 122 is enforced to be liquefied first, and is liquefied more than the wall of the pipe member 10 at the open end 101. As such, it can ensure that the wall of the pipe member 10 at the open end 101 will not be damage due to the fusion in the welding process. The flange 122 does not only provide axial positioning of the base 12 to the pipe member 10, but also serve as fusion region between the pipe member 10 and the base 12 to obtain a good welding effect. Thereby, the heat pipe 1 can be fabricated by mass production with enhanced yield rate.

Figure 6:
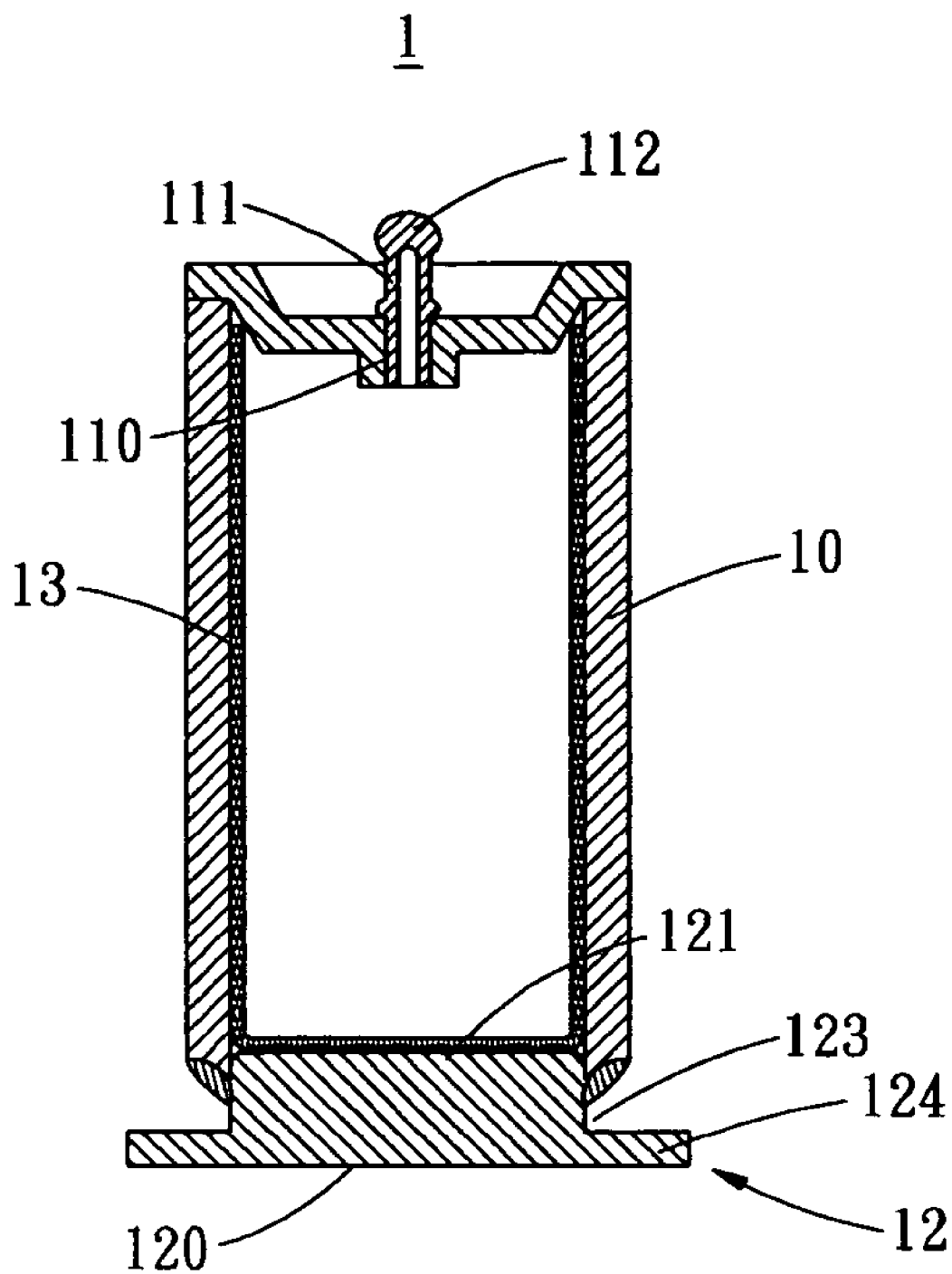
FIG. 6 shows a cross sectional view of a heat pipe according to another preferred embodiment.

Finally, as shown in FIG. 6, it illustrates another preferred embodiment of the present invention. In this preferred embodiment, the heat conducting portion 124 is extended outwardly to enlarge the contact area of the outside surface 120 of the base 12 to obtain more effective heat dissipation.

While the present invention has been particularly shown and described with reference to preferred embodiments thereof, it will be understood by those of ordinary skill in the art the various changes in form and details may be made therein without departing from the spirit and scope of the present invention as defined by the appended claims.

What is claimed is:

1. A heat pipe, comprising:
   a pipe member having two opposing open ends;
   a lid closely covered on one open end;
   a base having an interlocking member to fitly engaged to the pipe member at the other open end thereof, and a flange extending radially and outwardly from the interlocking member, wherein a thickness of the flange is not larger than a thickness of the pipe member at the open end receiving the interlocking member; and
   a wick structure attached on an inner wall of the pipe member and an inside surface of the base,
   wherein the flange is made by forming an annular recess along a periphery of the base.

2. The heat pipe as claimed in claim 1, wherein the pipe member is a cylindrical pipe.

3. The heat pipe as claimed in claim 1, wherein the lid includes a filling tube mounted thereon for working fluid to be filled in the pipe member.

4. The heat pipe as claimed in claim 3, wherein the pipe member is sealed with a sealing structure on the filling tube.

5. The heat pipe as claimed in claim 1, wherein the base includes a flat surface opposite to the inside surface for contact with a heat source.

6. The heat pipe as claimed in claim 1, wherein the base further includes a heat conducting portion formed under the annular recess.

7. The heat pipe as claimed in claim 6, wherein the heat conducting portion is extended to enlarge a contact area of an outside surface opposite to the inside surface for contact with a heat source.

8. The heat pipe as claimed in claim 1, wherein the flange has a periphery larger than an internal periphery of the pipe member at the open end receiving the interlocking member.

9. The heat pipe as claimed in claim 8, wherein the flange has the periphery no larger than an external periphery of the pipe member at the open end receiving the interlocking member.

* * * * *